United States Patent
Yoo et al.

(10) Patent No.: US 7,648,254 B2
(45) Date of Patent: Jan. 19, 2010

(54) BACKLIGHT FOR LIQUID CRYSTAL DISPLAY USING LIGHT EMITTING DIODE

(75) Inventors: Chul Hee Yoo, Gyunggi-do (KR); Hyun Ho Lee, Gyunggi-do (KR); Yoon Tak Yang, Gyunngi-do (KR); Myoung Bo Park, Choongcheongnam-do (KR); Sang Yun Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/783,949

(22) Filed: Apr. 13, 2007

(65) Prior Publication Data
US 2007/0242477 A1    Oct. 18, 2007

(30) Foreign Application Priority Data
Apr. 14, 2006    (KR)    ............... 10-2006-0034131

(51) Int. Cl.
*F21V 21/00*    (2006.01)

(52) U.S. Cl. ............... 362/249.01; 362/249.02; 362/612; 362/631

(58) Field of Classification Search ............... 362/257, 362/252, 249, 800, 630, 631, 612; 257/88, 257/99
See application file for complete search history.

(56) References Cited

U.S. PATENT DOCUMENTS

| | | | | | |
|---|---|---|---|---|---|
| 5,697,175 | A | * | 12/1997 | Schwartz | 40/552 |
| 5,727,310 | A | * | 3/1998 | Casson et al. | 29/830 |
| 7,000,999 | B2 | * | 2/2006 | Ryan, Jr. | 305/147 |
| 7,055,987 | B2 | * | 6/2006 | Staufert | 362/252 |

* cited by examiner

*Primary Examiner*—John A Ward
(74) *Attorney, Agent, or Firm*—McDermott Will & Emery LLP

(57) ABSTRACT

In an LCD backlight unit using a light emitting diode, a double-sided printed circuit board includes a plurality of divided areas and conductive vias. A plurality of light emitting diodes are disposed on a top surface of the double-sided printed circuit board. A plurality of driving circuit connectors are disposed at a portion of the double-sided printed circuit board. A plurality of first lead patterns are formed on the top surface of the printed circuit board, each of the first lead patterns electrically connecting the light emitting diodes in each of the divided areas with one another. Also, a plurality of second lead patterns are formed on an underside surface of the double-sided printed circuit board to electrically connect the first lead patterns with the connectors through the conductive vias.

4 Claims, 5 Drawing Sheets

BACKLIGHT FOR LIQUID CRYSTAL DISPLAY USING LIGHT EMITTING DIODE

CLAIM OF PRIORITY

This application claims the benefit of Korean Patent Application No. 2006-34131 filed on Apr. 14, 2006 in the Korean Intellectual Property Office, the disclosure of which is incorporated herein by reference.

BACKGROUND OF THE INVENTION

1. Field of the Invention

The present invention relates to a backlight for a liquid crystal display (LCD) using a light emitting diode, and more particularly, to an LCD backlight unit using a light emitting diode which is free from a problem of darkness caused in an area of an LCD panel corresponding to a connector equipped in the backlight unit to electrically connect a plurality of independently-driven LED modules to achieve local dimming.

2. Description of the Related Art

A cold cathode fluorescent lamp (CCFL) has been conventionally utilized as a light source of a light crystal display (LCD) backlight. The CCFL may trigger environmental pollution due to use of a mercury gas. Also, the CCFL is low in response rate and color reproducibility, and inadequate for reducing the weight and size of an LCD panel.

In contrast, a light emitting diode (LED) is environment-friendly and can respond fast with several nano seconds, thus effective in video signal stream. Moreover, the LED can be impulsively driven, reproduce colors by 100% or more and arbitrarily change brightness and color temperature by adjusting a light amount of red, green and blue LEDs. Also, the LED carries advantages leading to a lighter weight and smaller sized LCD panel. Thus the LED is actively adopted as a backlight source of the LCD panel.

In general, the LCD backlight employing the LEDs includes an edge-type backlight and a direct-type backlight depending on location of a light source. In the former, a light source is shaped as an elongated bar and disposed at a side of a light guide plate to irradiate light onto the LCD panel. In the latter, a surface light source is substantially identical in size to the LCD panel and disposed under the LCD panel to directly irradiate light onto the LCD panel. Especially, the direct type backlight unit directly irradiates light from just below the LCD panel. This advantageously allows light to be irradiated with different brightness onto some portion of the LCD panel, thereby achieving local dimming.

With such local dimming, a signal of an image to be displayed on the LCD panel is analyzed to find an area to be brighter or dimmer, and the brightness of a corresponding area of the backlight is controlled based on the analysis. This technology accordingly imparts more vividness to the image provided through the LCD panel. For example, in the image of explosion, brightness of the backlight source disposed just below an area of the LCD panel displaying such explosion can be increased through the local dimming, thereby ensuring more life-likeness and vividness to the scene.

FIG. 1a is a plan view illustrating a conventional LCD backlight used for local dimming. FIG. 1b is a partial cross-sectional view illustrating the LCD backlight cut along the line a-a'. Referring to FIGS. 1a and 1b, the conventional LCD backlight 10 for local dimming uses a combination of LED modules M1 to M12, each of which is designed to illuminate light onto a corresponding portion of an LCD panel. Each of the LED modules M1 to M12 includes a plurality of LEDs 121 disposed on a printed circuit board (PCB) 11. Each of the LED modules M1 to M12 may include at least one respective red, green and blue LEDs to produce white light. Also, out of the LEDs 121 in the LED module M1 to M12, the LEDs of the same color are electrically connected with one another. For this electrical connection, first lead patterns (not illustrated) are formed on some areas of the PCB where the LEDs are not disposed.

Each of the LED modules M1 to M12 is independently driven to illuminate light of different brightness, thereby implementing local dimming. To this end, a plurality of driving circuits are provided to drive the LED modules M1 to M12, respectively. Each of the LED modules M1 to M12 should be electrically connected to a corresponding one of the driving circuits. To ensure electrical connection with the external driving circuits, driving circuit connectors 15 are disposed in the LED modules M1, M5, and M9, respectively, in an outermost periphery of the backlight 10, which is the leftist side in FIG. 1. Here, in each of the LED modules M1, M5 and M9 located in the leftist side of the backlight, each of the first lead patterns is directly connected to a corresponding one of the driving circuit connectors 15. However, the LED modules M2 to M4, M6 to M8 and M10 to M12 located right from the LED modules M1, M5 and M9 cannot be directly connected to the driving circuit connectors 15, respectively. Thus the LED modules M1 to M12 are connected to the adjacent ones thereof through module connectors 13. For example, note the LED modules (first modules) M1, M5 and M9 located in the leftist side and the LED modules (second modules) M2, M6 and M10 located right next thereto in FIG. 1a. As described above, each of the first modules M1, M5, and M9 should be provided with the lead pattern for connecting the LEDs on the PCB 11. Besides, the first modules 1, M5, and M9 should be provided with second lead patterns for each connection between the corresponding one of the module connectors 13 and the corresponding one of the driving circuit connectors 15 thereby to be connected with a corresponding one of the second modules M2, M6 and M10. The second lead patterns connecting the LEDs of the second modules M2, M6, M10 on the PCB are connected to the first lead patterns of the first modules M1, M5, M9 through conductive lines 14 of the module connectors 13, thereby electrically connected to the driving circuit connectors 15. In a similar manner, the LEDs in each of the modules M3, M7, M11 located next to the right from the second modules M2, M6, M10 are eventually connected to the corresponding one of the driving circuit connectors 15 through the module connectors and the second lead patterns formed on the LED modules next to the left from the LED modules M3, M7 and M11.

In the conventional LCD backlight 10 for local dimming configured as above, the LED modules M1 to M12 should be provided with not only the first lead patterns for connecting the LEDs 121 disposed in each of the LED modules but also the second lead patterns for connecting the adjacent LED modules with the driving circuit connectors 15. This disadvantageously complicates a wiring configuration. Notably, in a case where the backlight adopts small LEDs, a great number of LEDs should be disposed densely on the PCB, thus very hard to secure a space for forming the first and second lead patterns.

Also, as shown in FIG. 1b, the module connectors 13 for electrically connecting the LED modules and the conductive lines 14 are formed higher than the LEDs 121. Accordingly light generated from the LEDs 121 are blocked by the module connectors 13 and conductive wires 14. This causes darkness in an area D of an LCD panel corresponding to the module connectors 13, thereby hindering proper illumination.

SUMMARY OF THE INVENTION

The present invention has been made to solve the foregoing problems of the prior art and therefore an aspect of the present invention is to provide a light crystal display (LCD) backlight using a light emitting diode (LED), in which a plurality of LEDs are disposed in each of divided areas and driven through separate driving circuits to achieve local dimming, and also a double-sided printed circuit board (PCB) having conductive vias therein is employed and conductive lines for electrically connecting the LEDs in each of the divided areas with a corresponding one of driving circuit connectors are formed opposite to a surface where the LEDs are disposed, thereby obviating a need for module connectors and simplifying a wiring configuration.

According to an aspect of the invention, the backlight for the liquid crystal display using the light emitting diode (LED) includes a double-sided printed circuit board including a plurality of divided areas and conductive vias; a plurality of LEDs disposed on a top surface of the double-sided printed circuit board; a plurality of driving circuit connectors disposed at a portion of the double-sided printed circuit board; a plurality of first lead patterns formed on the top surface of the printed circuit board, each of the first lead patterns electrically connecting the light emitting diodes in each of the divided areas with one another; and a plurality of second lead patterns formed on an underside surface of the double-sided printed circuit board to electrically connect the first lead patterns with the connectors through the conductive vias.

According to a preferred embodiment of the invention, the double-sided printed circuit board further includes heat radiating vias each formed underneath each of the light emitting diodes, the heat radiating vias extending through the top surface of the double-sided printed circuit board to the underside surface thereof.

According to a preferred embodiment of the invention, the backlight further includes an insulating heat radiation pad disposed in contact with the underside surface of the double-sided printed circuit board.

According to a preferred embodiment of the invention, at least one of the first lead patterns in a corresponding one of the divided areas adjacent to the connectors are directly connected to the connectors.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a cross-sectional view illustrating the LCD backlight cut along the line a-a' of FIG. 1a;

DETAILED DESCRIPTION OF THE PREFERRED EMBODIMENT

Figure 1A:
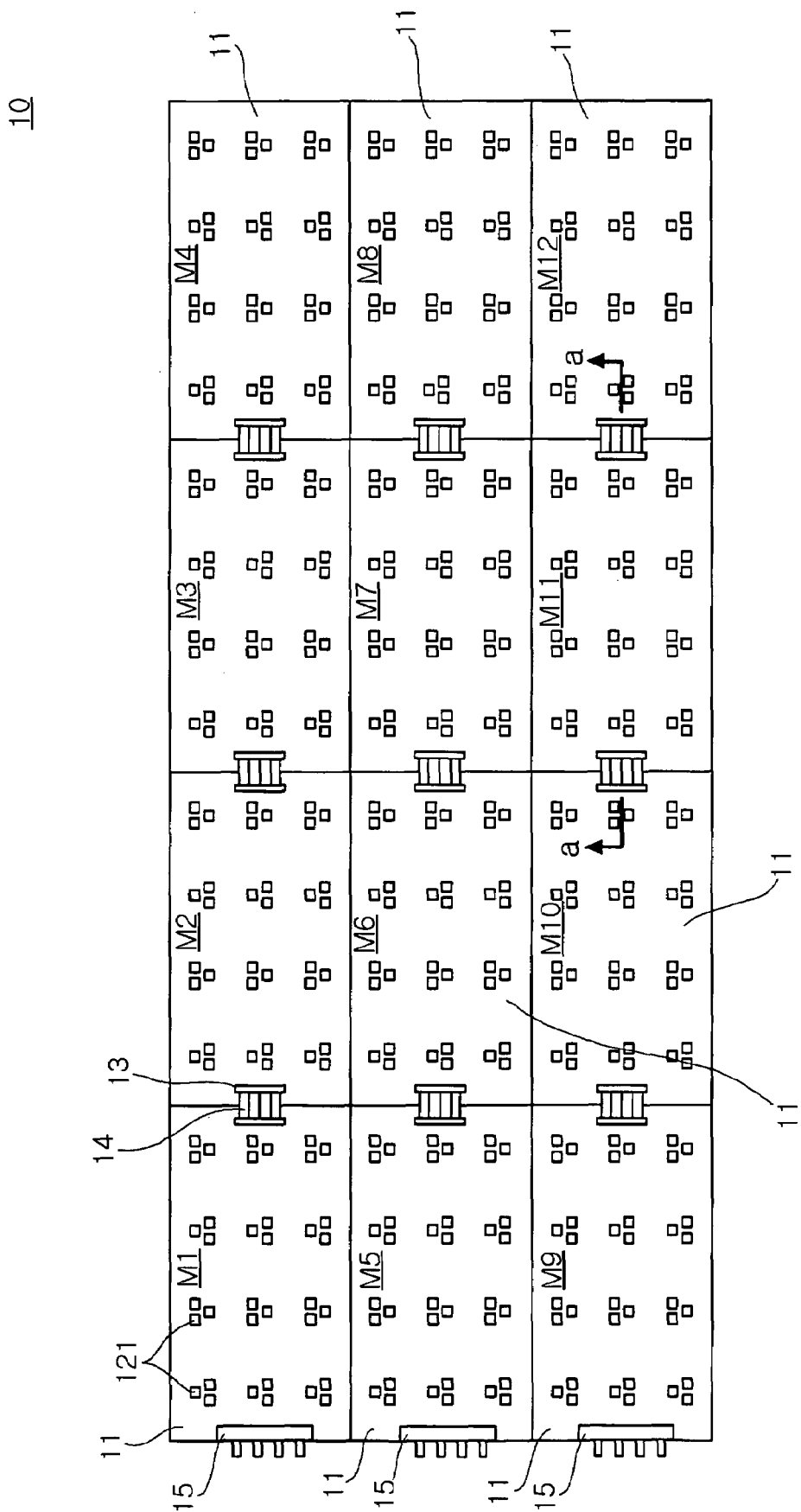
FIG. 1a is a plan view illustrating a conventional LCD backlight for local dimming.
Figure 1B:
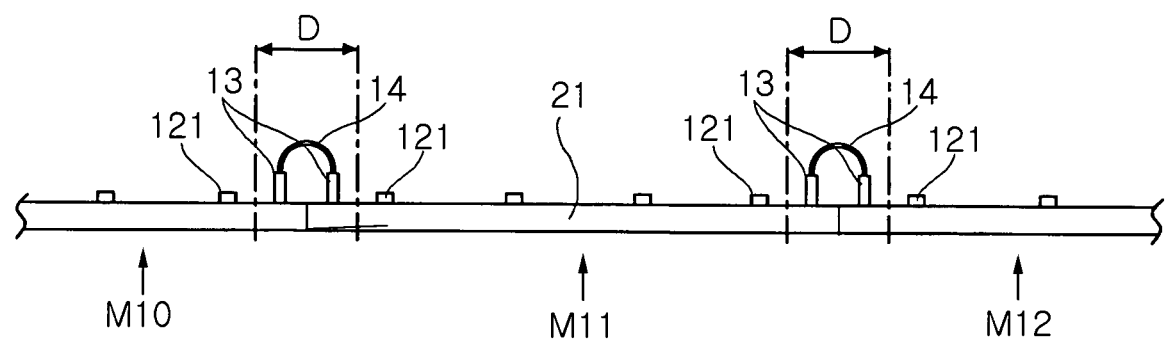

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2A:
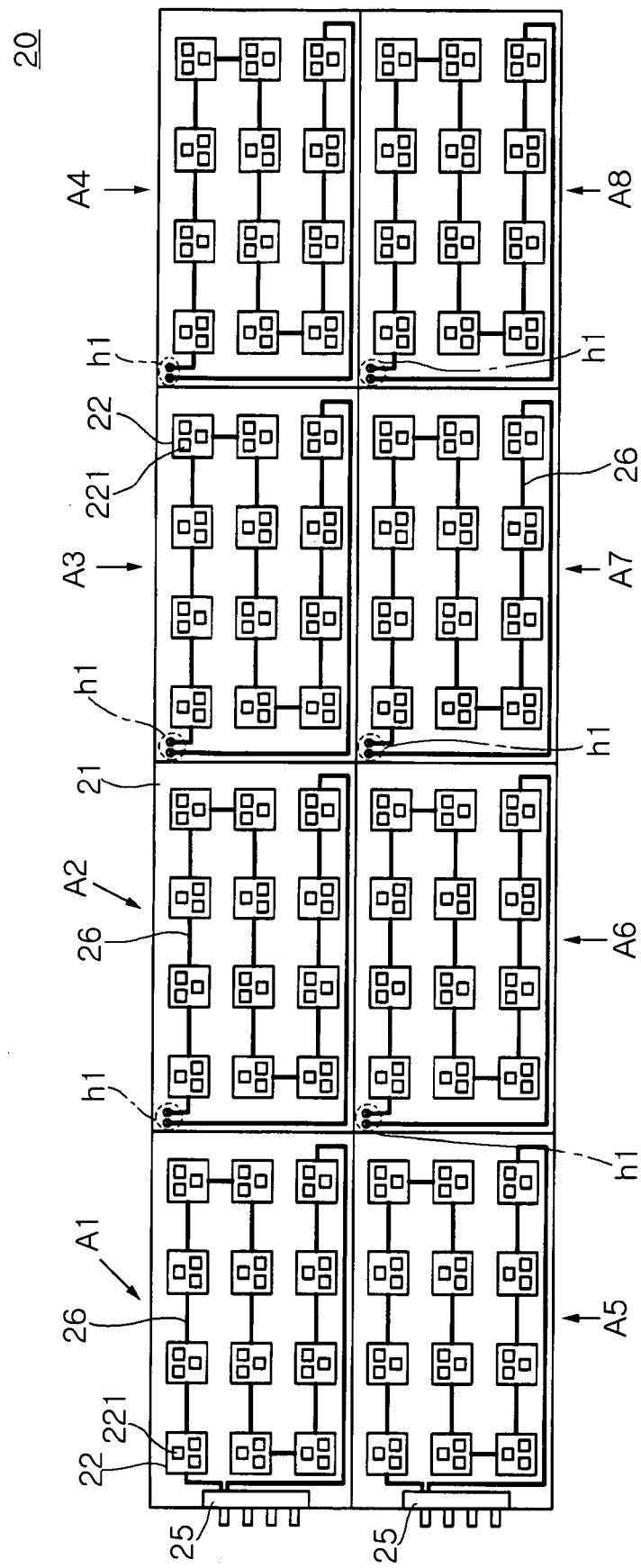
FIG. 2a is a schematic plan view illustrating a top surface of an LCD backlight according to an embodiment of the invention.
Figure 2B:
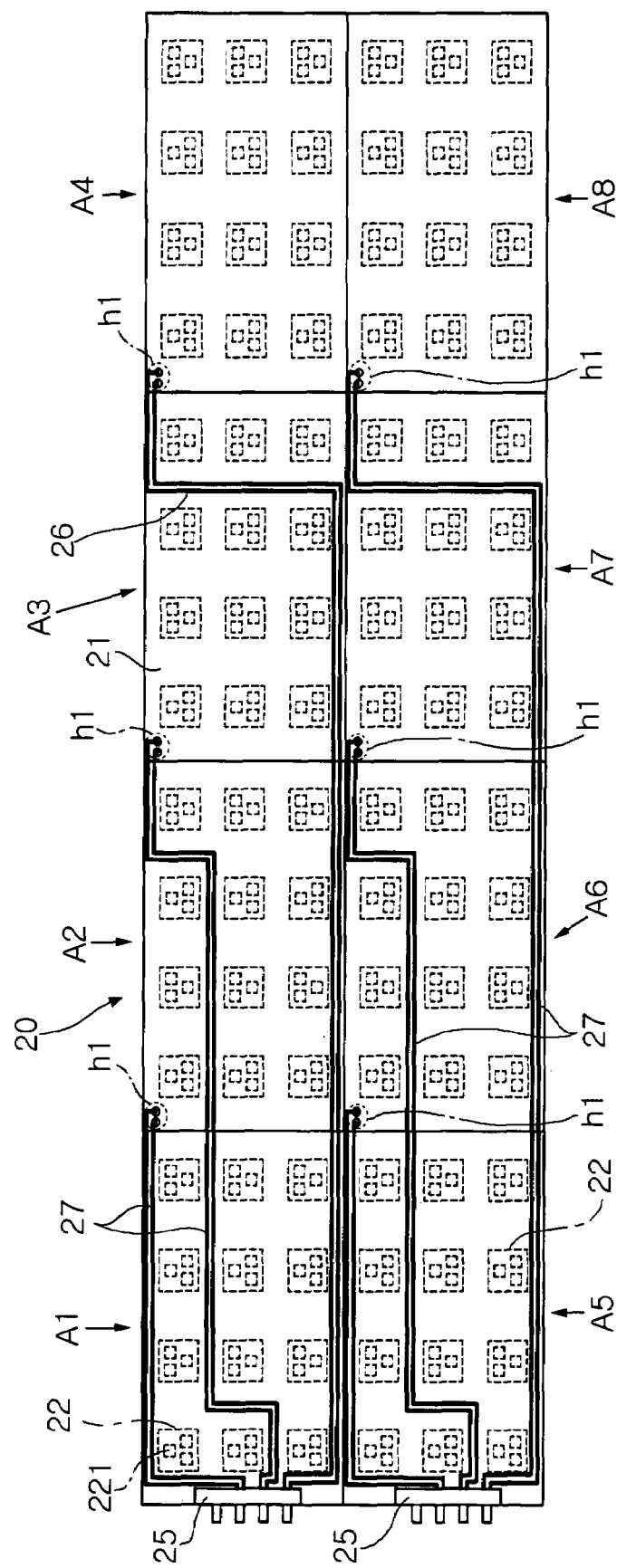
FIG. 2b is a perspective plan view illustrating a back surface of the LCD backlight of FIG. 2a, seen from the top surface thereof.

FIG. 2a is a schematic plan view illustrating a top surface of a liquid crystal display (LCD) backlight light according to an embodiment of the invention. FIG. 2b is a perspective plan view illustrating a back surface of the LCD backlight of FIG. 2a, seen from the top surface thereof.

Referring to FIGS. 2a and 2b, the LCD backlight 20 using a light emitting diode LED according to an embodiment of the invention includes a double-sided printed circuit board (PCB) 21, a plurality of LEDs 221, a plurality of driving circuit connectors 25, a plurality of first lead patterns 26 and a plurality of second lead patterns 27. The double-sided printed circuit board PCB 21 includes a plurality of divided areas A1 to A8 and conductive vias h1. The LEDs 221 are disposed on a top surface of the double-sided PCB 21. The driving circuit connectors 25 are disposed at a side portion of the double-sided PCB 21. Each of the first lead patterns 26 electrically connect the LEDs 221 disposed in each of the divided areas A1 to A8. The second lead patterns 27 are formed on an underside surface of the double-sided PCB 21 to electrically connect the first lead patterns 26 with the connectors 25 through the conductive vias h1. Moreover, the LCD backlight 20 using the LED according to an embodiment of the invention may further include an insulating heat radiation pad (reference numeral 27 of FIG. 3) disposed in contact with the underside surface of the double-sided PCB 211.

The double-sided PCB 21 has the divided areas A1 to A8 formed therein as described above. According to the invention, the backlight structure for use in the LCD enables local dimming by controlling backlight illumination based on the divided areas and generating light of different brightness and color coordinates in each of the divided areas. To achieve such local dimming, driving circuits should be formed in the respective divided areas to drive the LEDs disposed therein. FIGS. 2a and 2b illustrate the double-sided PCB 21 having divided areas configured as two rows and four columns (2×4). But the invention is not limited to a specific number of the divided areas.

Electric and electronic devices can be surface-mounted on the top and underside surfaces of the double-sided PCB 21. The conductive lead patterns can be formed on the top and underside surfaces of the double-sided PCB 21 to electrically connect the devices mounted. Therefore, according to the invention, the LEDs 221 are disposed on one of the surfaces of the double-sided PCB 21, and the first lead patterns are formed in the divided areas, respectively, so that the LEDs disposed in each area are connected with one another. Meanwhile, the second lead patterns are formed on the other surface of the double-sided PCB 21 to connect the driving circuit connectors 25 disposed at a portion of the double-sided PCB 21 with the LEDs disposed in the divided areas. This eliminates a conventional need for the module connectors for connecting modules with one another and simplifies arrangement of the lead patterns.

The LEDs 221 are disposed on the top surface of the double-sided PCB 21. The LEDs 221 should generate white light to backlight the LCD panel. Thus, the LEDs 221 include a red LED, a green LED and a blue LED which are combined together to generate white light. FIGS. 2a and 2b illustrate LED clusters 22 each having the LEDs of respective colors. Here, the first conductive patterns 26 electrically connect the LEDs so that same color LEDs are electrically connected with one another in each of the divided areas A1 to A8 of the double-sided PCB 21 through a corresponding one of the first conductive patterns 26.

The driving circuit connectors 25 are disposed at a portion of the double-sided PCB 21. Preferably, each of the driving circuit connector 25 is formed in each row of a matrix of the divided areas. That is, the connector 25 is provided at an edge of the first divided area A1 which is in the leftist side of the divided areas, i.e., in a row defined by the first to fourth divided areas A1 to A4. Alternatively, the connector 25 may be disposed at an edge of the fifth divided area A5 of the divided areas, i.e., in a row defined by the fifth to eighth divided areas A5 to A8. The driving circuit connectors 25 electrically connect the LEDs disposed in the divided areas A1 to A8 with corresponding driving circuits for driving the LEDs according to the divided areas A1 to A8.

Each of the first lead patterns 26 is formed on the top surface of the double-sided PCB 21 to electrically connect the LEDs 221 disposed in the corresponding one of the divided areas A1 to A8 with one another. For example, the LEDs disposed in the first divided area A1 are connected in series with one another in the first divided area A1 through the first lead pattern 26. In a schematic illustration of FIGS. 2a and 2b, the LED clusters 22 in the corresponding divided area are connected with one another through the lead pattern 26. However, actually, the LEDs of the same color are connected in series with one another so that the first lead pattern 26 is configured as a plurality of lines for connecting the LEDs of each color.

The second lead patterns 27 electrically connect the first lead patterns 26 to the connectors 25 through conductive vias h1 formed in the double-sided PCB 21. The second lead patterns 27 are also configured as a plurality of lines for connecting the LEDs of each color. As described, according to the invention, the LEDs 221 disposed in the divided areas A2 to A4 and A6 to A8 are electrically connected to a corresponding one of the driving circuit connectors 25 through the respective first lead patterns 26 formed on the top surface of the double-sided PCB 21, the respective conductive vias h1 formed in the double-sided PCB 21, and the second lead patterns 27 formed on the underside surface of the double-sided PCB 21. That is, according to the invention which adopts the double-sided PCB 21 of the invention, only the first lead patterns 27 are formed on the top surface of the PCB 21 to each connect the LEDs in the corresponding one of the divided areas A1 to A8 with one another. Also, the first lead patterns 27 are connected to the corresponding one of the driving circuit connectors 25 through the conductive vias h1 formed in the double-sided PCB 21 and the second lead patterns 27 formed on the underside surface of the double-sided PCB 21. This ensures a greater space for forming the lead patterns compared to a conventional backlight for local dimming, thereby simplifying a connection structure on the PCB. Moreover, this connection structure of the lead patterns obviates a need for conventional module connectors for electrically connecting the LEDs modules and the divided areas, thereby precluding a problem of darkness.

Figure 3:
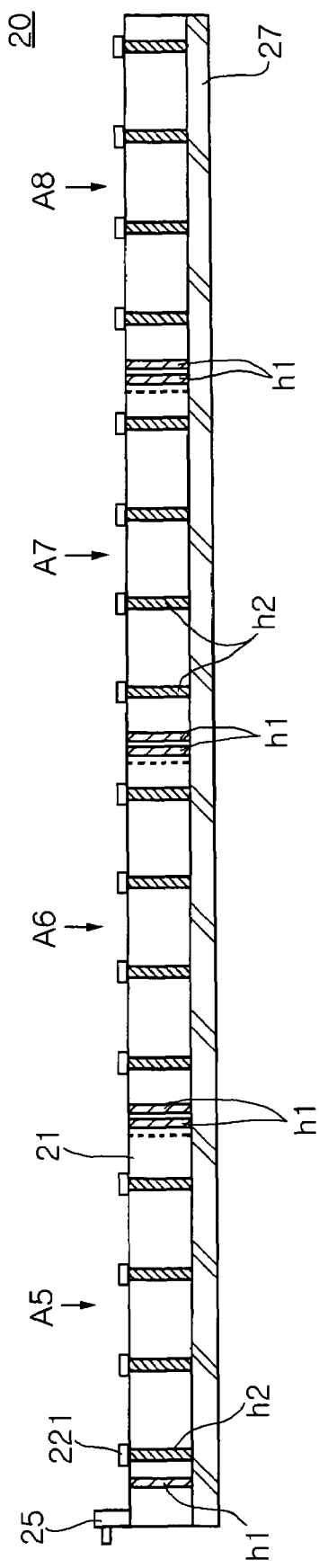
FIG. 3 is a schematic side cross-sectional view illustrating an LCD backlight according to another embodiment of the invention.

FIG. 3 is a schematic side cross-sectional view illustrating a light crystal display backlight according to an embodiment of the invention. The conventional cross-section PCB typically employs a metal PCB using a metal core to improve heat radiation effects. In contrast, the invention adopts a double-sided PCB made of a material such as FR4, thereby requiring a structure for enhancing heat radiation efficiency. FIG. 3 illustrates heat radiating vias and insulating pads for increasing heat radiation efficiency.

Referring to FIG. 3, the double-sided PCB 21 of the double-sided backlight 20 according to an embodiment of the invention 21 may further include heat radiating vias h2 for outwardly radiating heat generated from a plurality of LEDs 221 disposed on a top surface of the double-sided PCB 21 in addition to conductive vias h1 for electrically connecting the first lead patterns (reference numeral 26 of FIG. 2a, not illustrated in FIG. 3) to second lead patterns (reference numeral 27 of FIG. 2b, not illustrated in FIG. 3). Preferably, the heat radiating vias h2 each are formed underneath each of the LEDs 221, thereby maximizing heat radiation effects. The heat radiating vias h2 are made of a material with superior thermal conductivity such as Cu and Al.

Also, preferably, an insulating heat radiation pad 27 is affixed onto an underside surface of the double-sided PCB 21 of the LCD backlight 20 according to this embodiment of the invention. This insulating heat radiation pad 27 ensures heat transferred through the heat radiating vias h2 to be radiated in a larger area and also the underside surface of the PCB 21 to be insulated from other areas. According to the invention, the second lead patterns (reference numeral 27 of FIG. 2b) are formed on the underside surface of the double-sided PCB where electrical signals are transmitted, thus required to be insulated from other areas. Preferably, the second lead patterns are made of e.g., Si which can assure satisfactory heat radiation and insulation effects at the same time.

As described above, according to the invention, the divided areas are formed on the double-sided PCB to suitably achieve local dimming. Also, a plurality of LEDs disposed in each of the divided areas are connected with one another through a corresponding one of the first lead patterns on the double-sided PCB. Meanwhile, the first lead patterns and the driving circuit connectors are connected together through conductive vias formed in the PCB and the second lead patterns formed on the underside surface of the PCB. This ensures a sufficient area for line connection on a surface of the PCB. This simplifies a connection structure and obviates a need for separate connectors for connecting the divided areas, thereby precluding a problem of darkness.

As set forth above, according to exemplary embodiments of the invention, there is no need for connectors for connecting divided areas to achieve local dimming. This advantageously prevents occurrence of darkness resulting from such connectors.

Moreover, the invention adopts a double-sided PCB to secure a sufficient area for line connection on a surface of the PCB. This allows a connection structure to be designed with simplicity and flexibility.

What is claimed is:
1. A backlight for a liquid crystal display using a light emitting diode comprising:
a double-sided printed circuit board including a plurality of divided areas and conductive vias; a plurality of light emitting diodes disposed on a top surface of the double-sided printed circuit board;

a plurality of driving circuit connectors disposed at a portion of the double-sided printed circuit board; a plurality of first lead patterns formed on the top surface of the printed circuit board, each of the first lead patterns electrically connecting the light emitting diodes in each of the divided areas with one another; and a plurality of second lead patterns formed on an underside surface of the double-sided printed circuit board to electrically connect the first lead patterns with the connectors through the conductive vias.

2. The backlight according to claim 1, wherein the double-sided printed circuit board further comprises heat radiating vias each formed underneath each of the light emitting diodes, the heat radiating vias extending through the top surface of the double-sided printed circuit board to the underside surface thereof.

3. The backlight according to claim 1, further comprising an insulating heat radiation pad disposed in contact with the underside surface of the double-sided printed circuit board.

4. The backlight according to claim 1, wherein at least one of the first lead patterns in a corresponding one of the divided areas adjacent to the connectors are directly connected to the connectors.

* * * * *